United States Patent
Ma et al.

(10) Patent No.: US 9,197,465 B2
(45) Date of Patent: Nov. 24, 2015

(54) APPARATUS AND METHOD FOR A DIGITAL TRANSMITTER ARCHITECTURE WITH OUTPHASING POWER AMPLIFIER

(71) Applicant: FutureWei Technologies, Inc., Plano, TX (US)

(72) Inventors: Zhengxiang Ma, Summit, NJ (US); Munawar Kermalli, Morris Plains, NJ (US)

(73) Assignee: FUTUREWEI TECHNOLOGIES, INC., Plano, TX (US)

(*) Notice: Subject to any disclaimer, the term of this patent is extended or adjusted under 35 U.S.C. 154(b) by 0 days.

(21) Appl. No.: 14/198,375

(22) Filed: Mar. 5, 2014

(65) Prior Publication Data
US 2014/0269892 A1    Sep. 18, 2014

Related U.S. Application Data

(60) Provisional application No. 61/789,083, filed on Mar. 15, 2013.

(51) Int. Cl.
*H04L 25/03* (2006.01)
*H03F 3/68* (2006.01)
(Continued)

(52) U.S. Cl.
CPC .......... *H04L 25/4902* (2013.01); *H03F 1/0294* (2013.01); *H03F 3/195* (2013.01);
(Continued)

(58) Field of Classification Search
CPC ....... H03F 1/3247; H03F 3/24; H03F 1/3241; H03F 3/602; H03F 1/0288; H03F 3/211; H03F 2200/451; H03F 1/0294; H03F 3/217; H03F 3/2176; H03F 2200/387; H03F 2200/408; H03F 2203/7236; H03F 2200/432; H03F 2200/507; H04L 27/368; H04L 25/03847; H03G 3/3042; H04B 1/0483; H04B 2001/0408
USPC ................. 375/295, 238, 296, 297; 330/250, 330/124 R; 332/106, 107, 117, 123, 149, 332/159, 160
See application file for complete search history.

(56) References Cited

U.S. PATENT DOCUMENTS 7,009,447 B2    3/2006  Korol
8,095,092 B2    1/2012  Muller et al.
(Continued)

OTHER PUBLICATIONS

Lei Ding et al., "A 25 dBm Outphasing Power Amplifier with Novel Non-Isolated Combining Network," IEEE radio Frequency Integrated Circuits Symposium, 2014, pp. 231-234.*
(Continued)

*Primary Examiner* — Tesfaldet Bocure
(74) *Attorney, Agent, or Firm* — Slater & Matsil, L.L.P.

(57) ABSTRACT

System and method embodiments are provided for improving power efficiency in an outphasing amplifier with a non-isolating combiner. Some embodiments include a circuit comprising a signal decomposer configured to receive an input signal, a non-isolating combiner coupled to the signal decomposer and configured to provide an amplified output signal corresponding to the input signal, a first power amplifiers (PA) on a first branch between the signal decomposer and the non-isolating combiner, a second PA on a second branch between the signal decomposer and the non-isolating combiner, and a switch on the second branch between the signal decomposer and the second PA. The switch is configured to disconnect the second PA from the signal decomposer upon determining that the input signal is in a first condition, and further configured to connect the second PA to the signal decomposer upon determining otherwise.

26 Claims, 9 Drawing Sheets

(51) Int. Cl.
*H04L 25/49* (2006.01)
*H03F 1/02* (2006.01)
*H03F 3/195* (2006.01)
*H03F 3/217* (2006.01)
*H03F 3/24* (2006.01)

(52) U.S. Cl.
CPC ............... *H03F 3/217* (2013.01); *H03F 3/24* (2013.01); *H04L 25/03847* (2013.01); *H03F 2200/165* (2013.01); *H03F 2200/249* (2013.01); *H03F 2200/432* (2013.01)

(56) References Cited

U.S. PATENT DOCUMENTS

| | | | | |
|---|---|---|---|---|
| 8,346,189 | B2* | 1/2013 | Dupuy et al. | 455/114.1 |
| 8,451,053 | B2 | 5/2013 | Perreault et al. | |
| 8,472,896 | B2* | 6/2013 | Xu et al. | 455/110 |
| 8,659,353 | B2 | 2/2014 | Dawson et al. | |
| 8,824,978 | B2* | 9/2014 | Briffa et al. | 455/102 |
| 8,913,974 | B2 | 12/2014 | Sorrells et al. | |
| 2005/0110590 | A1* | 5/2005 | Korol | 332/149 |
| 2013/0241625 | A1 | 9/2013 | Perreault et al. | |
| 2014/0118063 | A1 | 5/2014 | Briffa et al. | |
| 2014/0120854 | A1* | 5/2014 | Briffa et al. | 455/127.3 |
| 2014/0125412 | A1 | 5/2014 | Dawson et al. | |
| 2014/0266464 | A1 | 9/2014 | Ma et al. | |
| 2014/0266465 | A1 | 9/2014 | Kermalli | |

OTHER PUBLICATIONS

Ilkka Hakala et al., "A 2.14-GHZ Chireix Outphasing Transmitter," IEEE Transactions on Microwave Theory and Techniques, vol. 53, No. 6, Jun. 2005, pp. 2129-2138.*

Gerhard, W., et al., "Improvement of Power Amplifier Efficiency by Reactive Chireix Combining, Power Back-off and Differential Phase Adjustment," IEEE MTT-S International Microwave Symposium Digest, Jun. 11-16, 2006, pp. 1887-1890.

Qureshi, J.H., et al., "A 90-W Peak Power GaN Outphasing Amplifier With Optimum Input Signal Conditioning," IEEE Transaction on Microwave Theory and Technologies, vol. 57, No. 8, Aug. 2009, pp. 1925-1935.

Chung, et al., "Asymmetic Multilevel Outphasing Architecure for Multi-Standard Transmitters," Radio Frequency Integrated Circuits Symposium, IEEE, RFIC, Jun. 7-9, 2009, pp. 237-240.

Perreault, David J., "A New Power Combining and Outphasing Modulation System for High-Efficiency Power Amplification," 53rd IEEE International Midwest Symposium on Circuits and Systems, Aug. 1-4, 2010, pp. 441-444.

* cited by examiner

APPARATUS AND METHOD FOR A DIGITAL TRANSMITTER ARCHITECTURE WITH OUTPHASING POWER AMPLIFIER

This application claims the benefit of U.S. Provisional Patent Application Ser. No. 61/789,083, filed on Mar. 15, 2013, and entitled "System and Method for a Digital Transmitter Architecture with Outphasing Power Amplifier," which application is incorporated herein by reference.

TECHNICAL FIELD

The present invention relates to power amplifier architecture and design, and, in particular embodiments, to an apparatus and method for a digital transmitter architecture with outphasing power amplifier.

BACKGROUND

An outphasing amplifier with a non-isolating combiner is an amplifier circuit that can provide substantially high power efficiency over a wide input range. However, the efficiency of such amplifier circuit drops quickly in the low power region, which can reduce the overall efficiency for amplifying a modulated waveform with a large peak to average power ratio. Moreover, the driver to the power amplifier (PA) in the circuit is always running at maximum power, and therefore dissipating power even at low amplifier power output, causing further degradation of the overall power efficiency of the system. While a high efficiency digital driver can be established with a pulse width modulation (PWM) technique, such driver lacks the dynamic range to support backed-off linear operation. There is a need of an improved architecture for the outphasing amplifier with a non-isolating combiner that overcomes such issues to improve overall power efficiency of the system.

SUMMARY OF THE INVENTION

In accordance with an embodiment, a power amplifier includes a signal decomposer configured to receive an input signal, a non-isolating combiner coupled to the signal decomposer and configured to provide an amplified output signal corresponding to the input signal, a first power amplifier (PA) on a first branch between the signal decomposer and the non-isolating combiner, a second PA on a second branch between the signal decomposer and the non-isolating combiner, and a switch on the second branch between the signal decomposer and the second PA. The switch is configured to disconnect the second PA from the signal decomposer upon determining that the input signal is in a first condition, and further configured to connect the second PA to the signal decomposer upon determining that the input signal is in a second condition different from the first condition. In an embodiment, the first condition is satisfied when the input signal is in a back-off power region with relatively low signal power, and the second condition is satisfied when the input signal is not in the back-off power region.

In accordance with another embodiment, a power amplifier circuit includes a signal decomposer configured to decompose an input signal into a first component signal and a second component signal, a first PA coupled to the signal decomposer and configured to amplify the first component signal, a second PA coupled to the signal decomposer and configured to amplify the second component signal upon receiving the second component signal from the signal decomposer, and a switch between the signal decomposer and the second PA configured to disconnect the second PA from the signal decomposer upon determining that the input signal is in a first condition and further configured to connect the second PA to the signal decomposer upon determining that the input signal is in a second condition. In an embodiment, the first condition is satisfied when the input signal is in a back-off power region with relatively low signal power, and the second condition is satisfied when the input signal is not in the back-off power region.

In accordance with yet another embodiment, a method for outphased power amplification includes receiving, at a signal decomposer, an input signal, determining whether the input signal is in a first power region or a second power region, and upon determining that the signal is in the second power region, linearly amplifying a portion of the input signal at a first power amplifier (PA) coupled to the signal decomposer. The method further includes passing the linearly amplified signal from the first PA through one of a capacitive branch or an inductive branch of a non-isolating combiner to provide an outphased amplified signal, and inhibiting any remaining portion of the signal from passing to a second PA coupled to the signal decomposer

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The structure and operation of presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

System and method embodiments are provided for improving power efficiency in an outphasing amplifier with a non-isolating combiner, such as a Chireix combiner. The embodiments include turning off input to one of the two outphasing devices (e.g., one of the two power amplifiers (PAs)) of the system in the low signal power region and operating the remaining device (e.g., the remaining PA) as a linear amplifier. The low signal power region is also referred to herein as the back-off region. Since one of the devices is not used in the back-off region, no power from the driver to that device is needed. As such, the quick drop in efficiency in the low power mode is limited or avoided, which improves the overall power efficiency of the system. For example, the efficiency is substantially improved for amplifying a modulated waveform with a large peak to average power ratio. Additionally, linear amplification using PWM drivers to the outphasing devices (or PAs) can be supported in the back-off region by outphasing the output of both the PWM drivers to drive the remaining outphasing device. In addition to higher overall efficiency, the embodiments allow higher level of integration of a transmitter and power amplifier system for relatively high dynamic range signals, such as for Long Term Evolution (LTE) signals. For instance, the systems and methods can be implemented to achieve a higher efficiency for a base station system.

Figure 1:
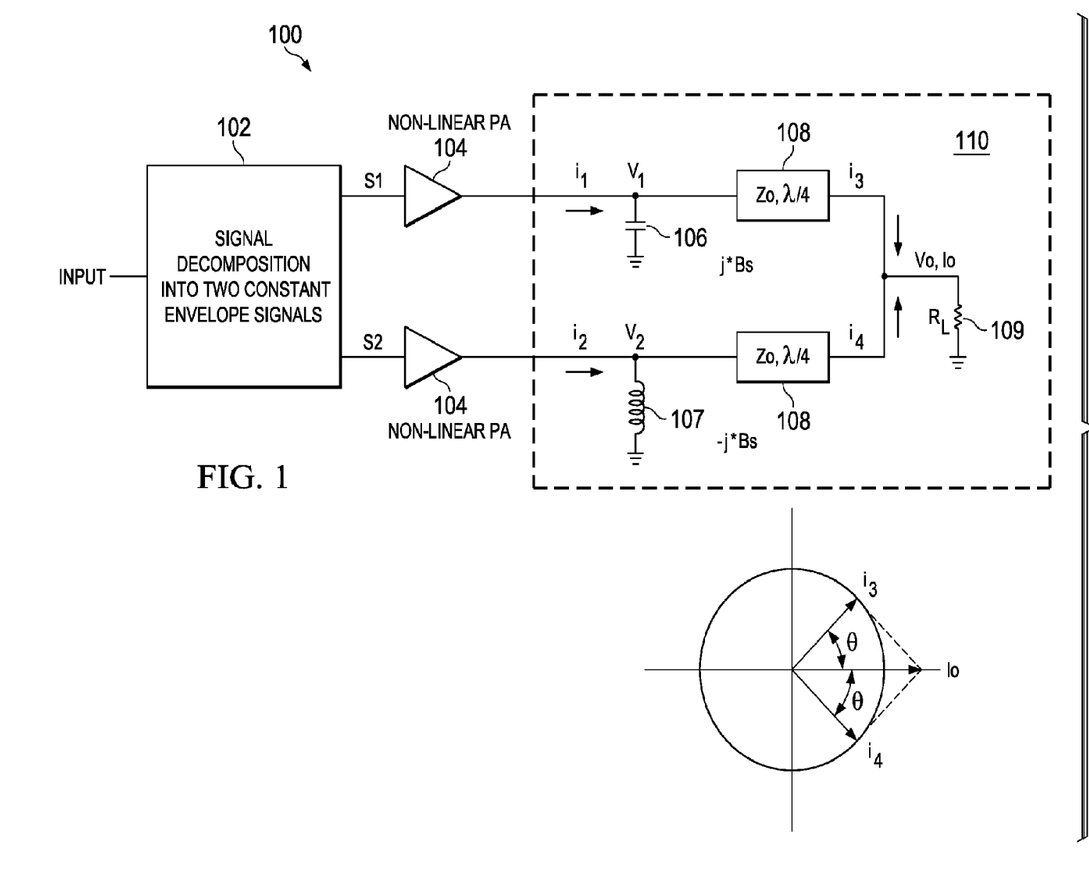
FIG. 1 shows a typical outphasing amplifier circuit with a Chireix combiner.

FIG. 1 shows a typical outphasing amplifier circuit 100 with a Chireix combiner 110. In addition to the Chireix combiner 110, the outphasing amplifier circuit 100 comprises a signal decomposition block 102 (e.g., including one or more circuit components or devices) and two PAs 104 (e.g., operating in non-linear amplification mode) coupled to the signal decomposition block 102 and the Chireix combiner 110. The system may be used in any transmitter/receiver (transceiver) component, such as in a communications devices or network component.

The signal decomposition block 102 decomposes an input signal into two constant envelope signals, S1 and S2, and sends S1 and S2 to two corresponding PAs 104. Each of the PAs 104 receives one of the constant envelope signals, amplifies the signal (e.g., in non-linear mode), and outputs the amplified signal to the Chireix combiner 110. The Chireix combiner 110 comprises a first branch coupled to one of the PAs 104 and a second branch coupled to the other PA 104. The first branch includes a capacitor 106 coupled in parallel to a quarter wave transmission line component 108 and a load or resistance 108. The second branch includes an inductor 107 coupled in parallel to a second quarter wave transmission line component 108 and the load or resistance 109. The Chireix combiner 110 combines a first output (current $i_3$) and a second output (current $i_4$) from the two corresponding branches 104 into an output $I_0$. The components of the Chireix combiner 110 may be arranged as shown in FIG. 1 or any other suitable arrangement. The load 109 may also be located outside the Chireix combiner 110.

As described above, the outphasing amplifier circuit 100 decomposes (using the signal decomposition block 102) an input signal with amplitude variation into two constant envelope signals, amplifies each of the two signals with high-efficiency non-linear amplifiers (the PAs 104), and combines (using the Chireix combiner 110) the amplitude signals to produce an amplified version of the input signal. The Chireix combiner 110 implements non-isolating combining, e.g., with there is no dissipation of radio frequency (RF) power in the combiner and the two nonlinear PAs 104 are load-pulling each other. The Chireix combiner 110 reactively loads each branch so that the nonlinear PAs 104 work in their high power efficiency region (e.g., on a Smith chart). High power efficiency is achieved when the amplifier uses relatively low driver power to provide relatively high amplification or gain to the signal.

However, the efficiency of the PAs 104 drops quickly when the input signal is in the back-off region (e.g., <10 dB back-off), e.g., in comparison to other PAs such as a Doherty PA. For example, in the case of high dynamic range signals such as LTE signals, the efficiency for a modulated waveform is no longer sufficiently high. Further, since the input signals are typically always at peak power level, significant driver power is required for the PAs 104, which lowers overall system efficiency.

Figure 2:
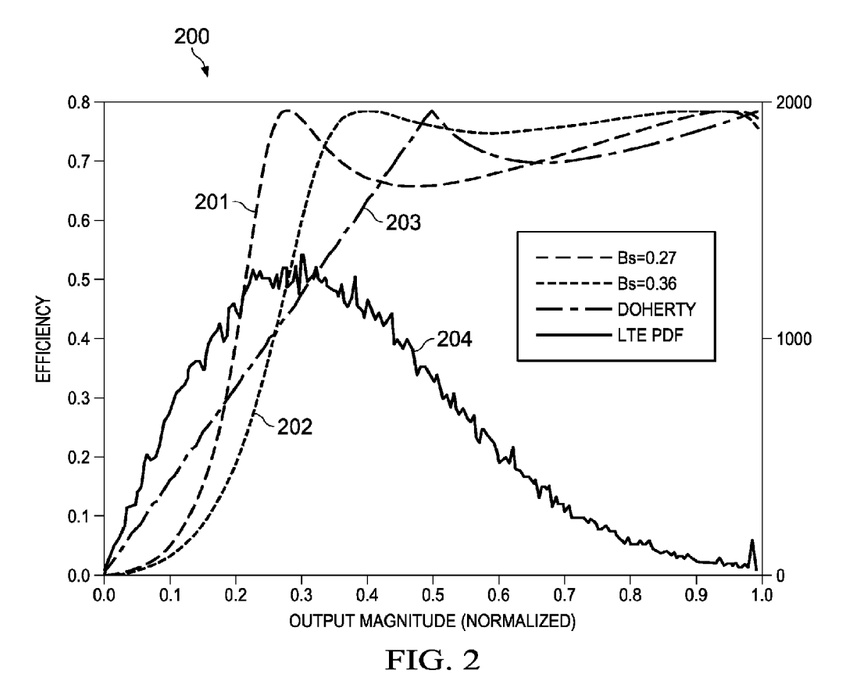
FIG. 2 shows a graph of the efficiency of the outphasing amplifier architecture of FIG. 1.
Figure 3:
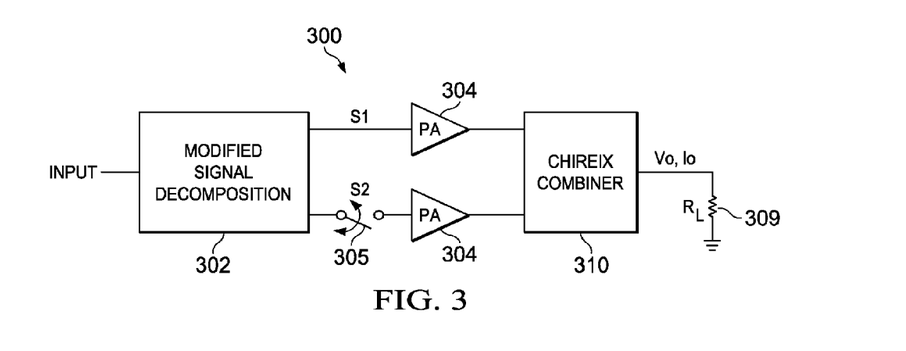
FIG. 3 shows an embodiment of a power amplifier (PA) circuit of present invention.

FIG. 2 shows a graph 200 of the efficiency of the a few PAs vs. normalized output magnitude. The graph 200 includes curves of efficiency vs. normalized output magnitude for a first PA where the reactive loading Bs=0.27 (normalized to the load resistance) (curve 201) and a second PA where the reactive loading Bs=0.36 (curve 202). For comparison, the graph 200 also includes an efficiency curve of a Doherty PA (curve 203). The graph 200 also shows the probability distribution function (PDF) curve of a LTE signal 204. As shown, curves 201 and 202 have higher efficiency than curve 203 for the Doherty PA for the LTE signal at output magnitudes higher than 0.2. However, the efficiency for curves 201 and 202 drops quickly below 0.2 output magnitude, where the efficiency of curve 203 becomes better, where the LTE PDF curve still shows significant probability FIG. 3 shows an embodiment of a PA circuit of present invention 300 that overcomes the efficiency drop issue in the back-off region. The circuit 300 comprises a signal decomposition block 302, two PAs 304 coupled to the signal decomposition block 302, a switch 305 inserted between the decomposition block 302 and one of the two PAs 304, a Chireix combiner 310 coupled to the two PAs 304, and a load 309 for output coupled to the Chireix combiner 310. The components of the partial outphasing PA circuit 300 are arranged as shown in FIG. 3 or any other suitable arrangement. The system may be used in any transmitter/receiver (transceiver) component, such as in a communications devices or network component. In another embodiment, any other type of suitable non-isolating combiner can be coupled to the two PAs 304 (instead of the Chireix combiner 310) to combine the two amplified component signals (S1 and S2).

In a normal operation mode (outside the back-off or reduced output power region), the switch 305 is closed, the components of the partial outphasing PA circuit 300 operate similar to their corresponding components of the outphasing amplifier circuit 100. However, to overcome the drop in efficiency of the PAs 104 in the back-off region, the switch 305 is open, preventing or inhibiting a second signal (S2) from the signal decomposition block 302 to reach the second PA 304, only one of the PAs 304 is used to amplify one incoming signal (S1) from the signal decomposition block 302. Thus, no driver power to the other PA 304 is needed. The switch 305 can be any mechanical or electrical switch (e.g., a diode switch). Alternatively, logical switching can be implement by turning off the input S2 to the corresponding PA 304. The operating PA 304 may be coupled to a capacitive branch of the Chireix combiner 310. In another embodiment, the operating PA 304 may be coupled instead to an inductive branch of the Chireix combiner 310. Further, the operating PA 304 is driven (e.g., by a driver) to operate in a linear amplification mode (instead of non-linear amplification for the normal operation mode). The signal decomposition block 302 may also be configured to operate in a different decomposition mode to modify the signal (e.g., S1) sent to the operating PA 304. For example, the signal sent (S1) is modified to provide a final output signal from the Chireix combiner 310 that represents the original input signal to the signal decomposer 302. As a result of this back-off operation, the efficiency of the PA circuit 300 is improved in the back-off region, which improves overall efficiency of the system, e.g., in comparison to the typical outphasing amplifier circuit 100.

Figure 4:
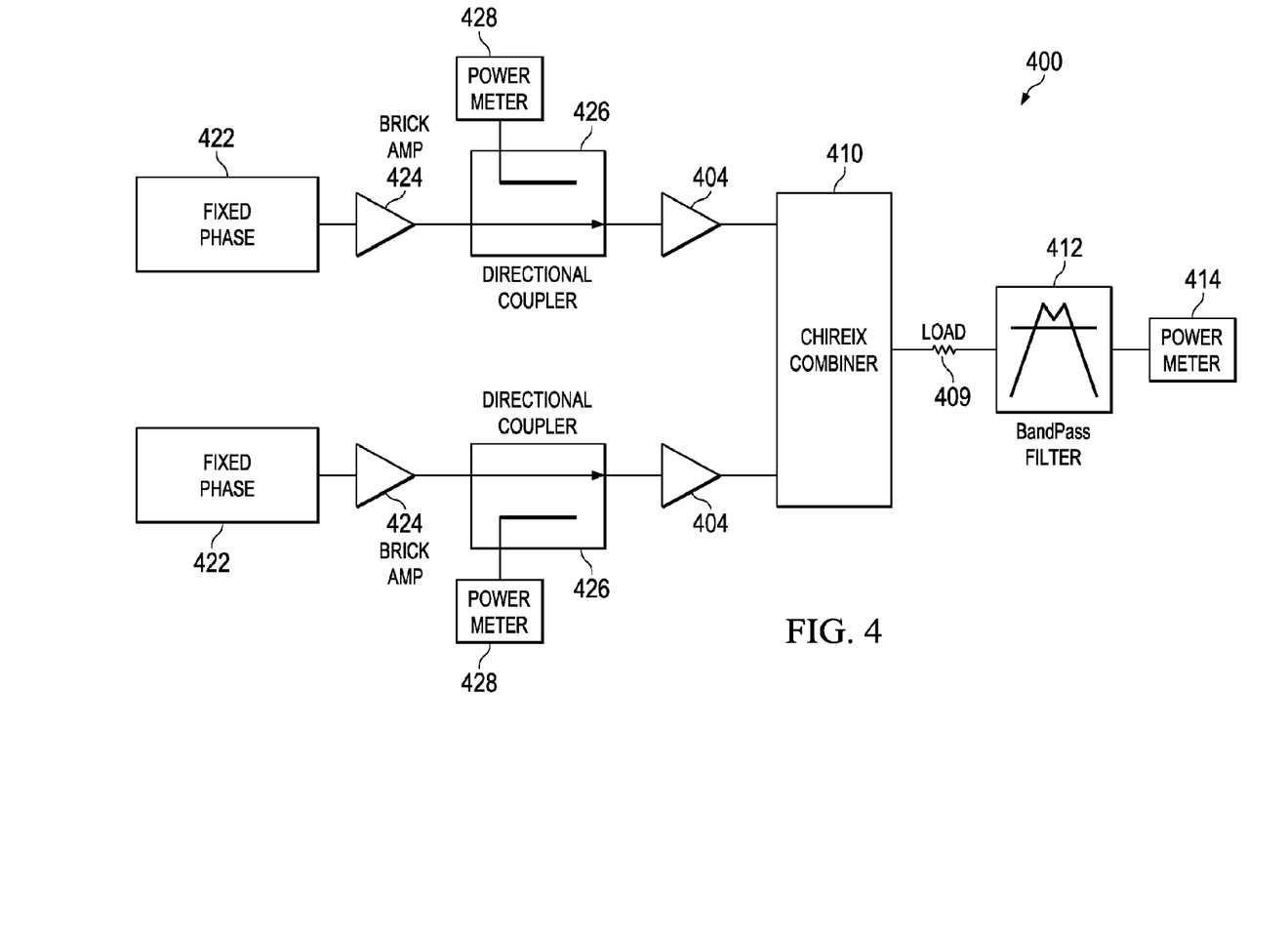
FIG. 4 shows an implemented laboratory setup for testing the PA circuit of FIG. 3.

FIG. 4 shows a laboratory setup 400 used for testing the partial outphasing PA circuit 310. The setup 400 comprises a Chireix combiner 410 (similar to the Chireix combiner 304) coupled to two amplifier 404 (similar to the PAs 304) and to a load 409 (similar to the load 309), as shown. Each amplifier 404 is coupled to a series or components, including a fixed phase signal source 422, a brick amplifier 424, a power meter 428, and a directional coupler 426 arranged as shown in FIG. 4. The load 409 on the other side of the Chireix combiner 410 is coupled to a power meter 414 via a bandpass filter 412.

Figure 5:
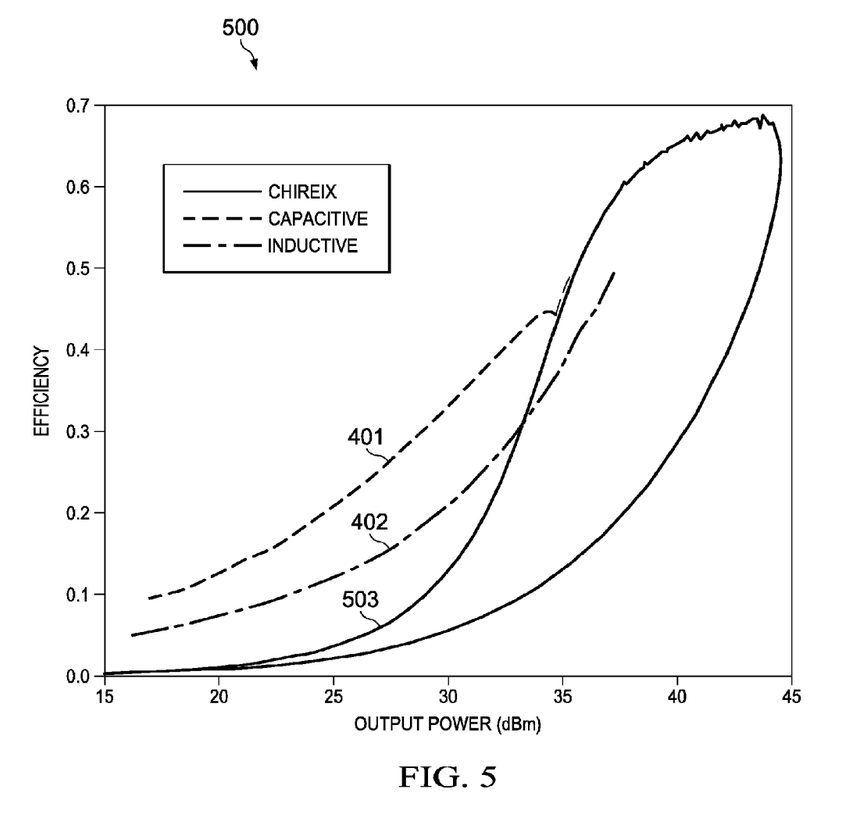
FIG. 5 shows a graph of the efficiency of the PA circuit of FIG. 3.

FIG. 5 shows a graph 500 of the efficiency of the PAs in circuit 300. The graph 500 is obtained using the setup 400. The graph 500 includes curves of efficiency vs. output power (in dBm) in the first amplifier 404 or PA 304 associated with the capacitive branch of the Chireix combiner (curve 501) driven with a linear input signal when the input to the other branch (inductive branch) is switched off and the second amplifier 404 or PA 304 associated with the inductive branch of the Chireix combiner (curve 502) driven with a linear input signal when the input to the other branch (capacitive branch) is switched off. For comparison, the graph 500 also includes an efficiency of the setup 400 when both amplifiers 404 or PA 304 are active and driving with constant envelope signals in conventional outphasing operation. As shown, curves 401 and 402 have higher efficiency than curve 503 in the back-off region, e.g., below 35 dBm. The improvement in efficiency for the back-off region is more significant using the capacitive branch corresponding to curve 501 than using the inductive branch corresponding to curve 502.

Figure 6:
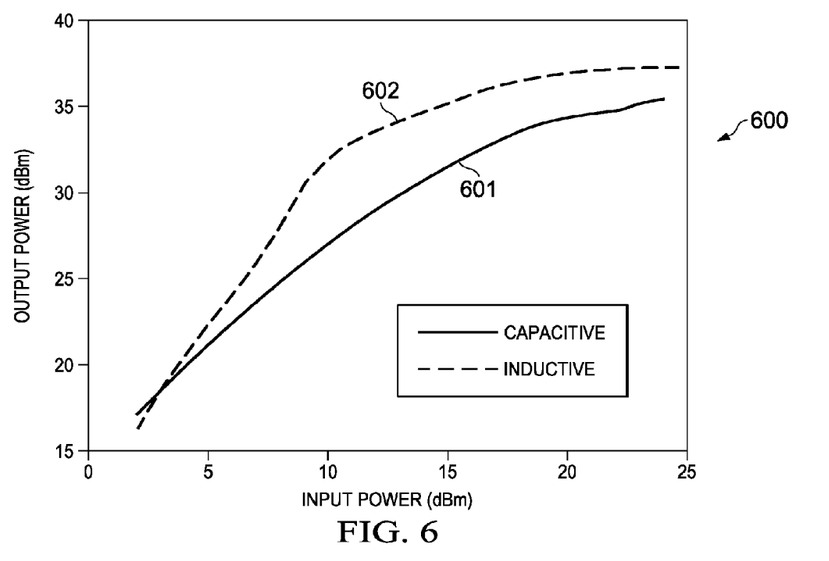
FIG. 6 shows a graph of the output power of the PA circuit of FIG. 3.
Figure 7:
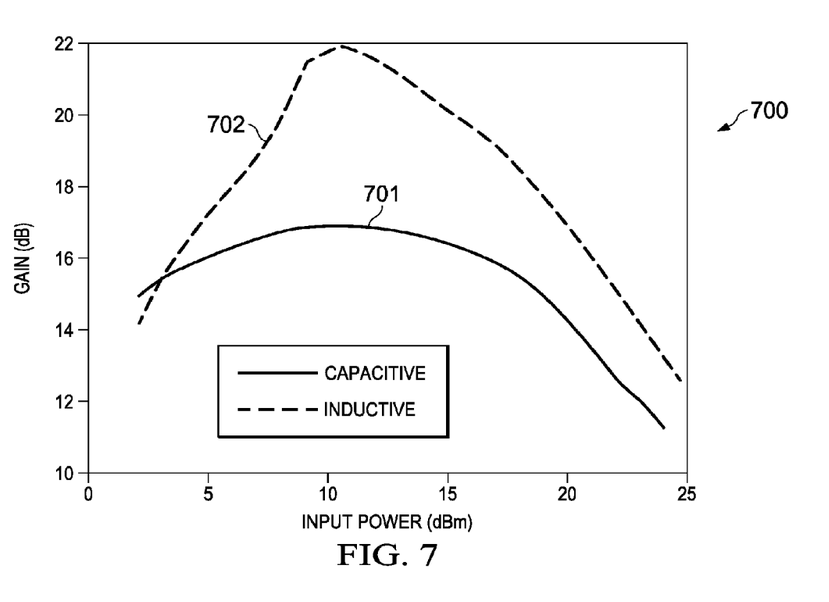
FIG. 7 shows a graph of the gain of the partial outphasing PA circuit of FIG. 3.

FIG. 6 shows a graph 600 of the output power of the capacitive and inductive branches in the PA circuit 300 when they are operated alone with an linear input while the input to the other branch is switched off. The graph 600 includes curves of output power vs. input power (in dBm) for the first amplifier 404 or PA 304 associated with the capacitive branch of the Chireix combiner (curve 601) and the second amplifier 404 or PA 304 associated with the inductive branch of the Chireix combiner (curve 602). FIG. 7 shows a graph 700 of the gain of the capacitive and inductive branches in the PA circuit 300 when they are operated alone with an linear input while the input to the other branch is switched off. The graph 700 includes curves of gain vs. output power (in dBm) for the first amplifier 404 or PA 304 associated with the capacitive branch of the Chireix combiner (curve 701) and the second amplifier 404 or PA 304 associated with the inductive branch of the Chireix combiner (curve 702). The curves in graphs 600 and 700 show that gain for both PAs (for the capacitive and inductive branches) is relatively high, e.g., in comparison to the gain achieved using the conventional outphasing amplifier circuit 100 (not shown). This may allow substantially reducing the power to the drivers of the PAs to obtain the same output power as in using the outphasing amplifier circuit 100 with the Chireix combiner 110.

In an embodiment, a PA circuit of present disclosure that has the improved efficiency in the back-off region as described above is also configured to use a pulse width modulation (PWM) signal as input to the PAs. A PWM signal output form can simplify the design of the transmitter circuit, reduce chip size, and lower power consumption. In the normal outphasing mode, the PWM drivers produce two square wave signals with approximately 50% duty cycle. In the back-off mode, the output of one of the PWM drivers is switched off, and the remaining PWM driver can simulate a linear output by changing the pulse width of the PWM signal. However, the PWM technique has a limited dynamic range, e.g., between about 10 to 15 dB. To support PWM output in the linear back-off operation of the PA circuit of present disclosure, the decomposed signal portion to the operating PA (e.g., S1) is outphased below a determined threshold to recover the original signal before decomposition. The recovered signal is then used to drive the branch of the operating PA in the linear amplification mode.

Figure 8:
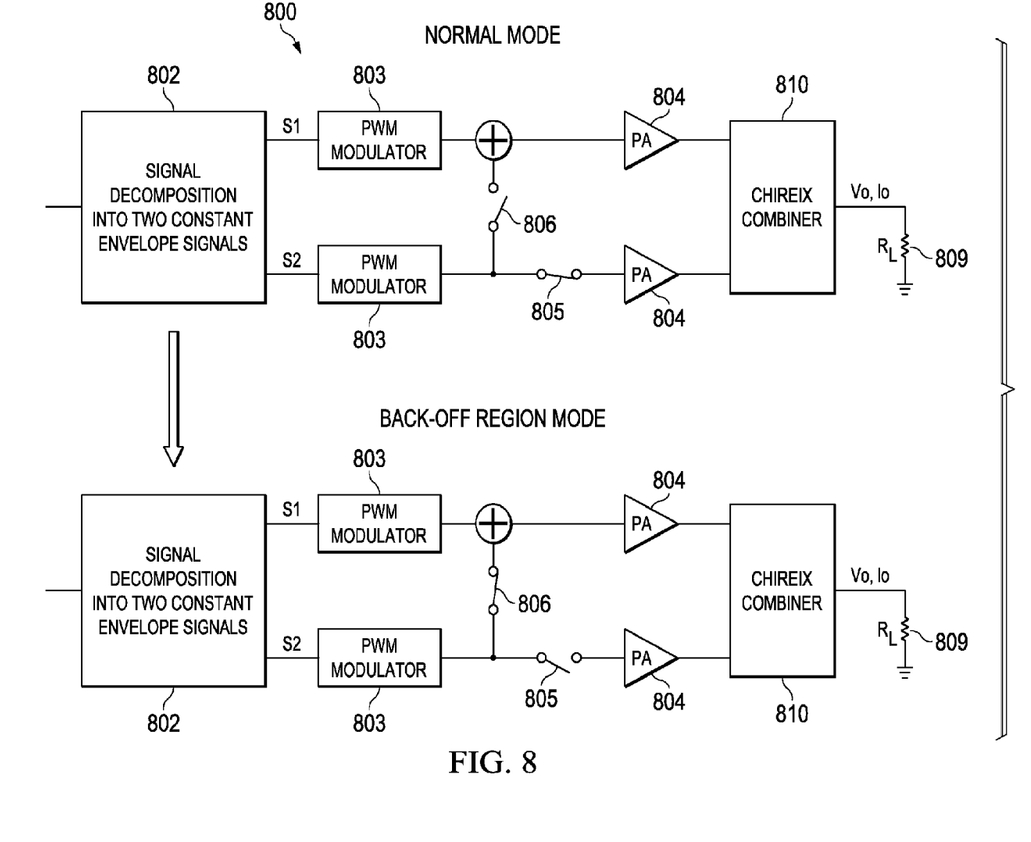
FIG. 8 shows another embodiment of the present invention.

FIG. 8 shows an embodiment of a PA circuit 800 that overcomes the limited dynamic range issue for PWM output. The PA circuit 800 comprises a signal decomposition block 802, two PAs 804 coupled to the signal decomposition block 802, a Chireix combiner 810 coupled to the two PAs 804, and a load 809 for output coupled to the Chireix combiner 810. Additionally, the partial outphasing circuit 800 comprises two PWM modulators 803 between the signal decomposition block 802 and the two corresponding PAs 804, a first switch 805 between one PWM modulator 803 and the corresponding PA 804, e.g., on the inductive branch of the Chireix combiner 810, and a second switch 806. The first switch 805 and the second switch 806 can include any mechanical and/or electrical switches (e.g., diodes). The components of the PA circuit 800 are arranged as shown in FIG. 8 or any other suitable arrangement. In another embodiment, any other type of suitable non-isolating combiner circuit can be coupled to the two PAs 804 (instead of the Chireix combiner 810) to combine the two amplified component signals (S1 and S2).

In a normal operation mode (outside the back-off region), the components of the PA circuit 800 operate similar to their corresponding components of the outphasing amplifier circuit 100. The first switch 805 is closed to send S2 to the corresponding PA 804 (e.g., on the inductive branch). The second switch 806 is opened to separate the signals between the two PAs 804 and respective branches. In the back-off region, only one of the PAs 804 is used to amplify the incoming signal, while the other PA 304 is switched off by opening the first switch 805. Both decomposed signals S1 and S2 from the signal decomposition block 802 are modulated by their respective PWM modulators 803 and then combined at the operating PA 804 (e.g., on the capacitive branch) to provide the original input signal or a combined signal that has larger dynamic range than the decomposed signals S1 and S2 individually. The first signal S1 is forwarded directly from the corresponding PWM modulator 803 to the operating PA 804, and the second signal S2 is redirected from its corresponding PWM modulator 803 to the same operating PA 804 by closing the second switch 806 (as shown in FIG. 8). The PA 804 then amplifies the combined signal with the increased dynamic range. As such, the translation from high power operation to low power operation for PWM output without loosing dynamic range can be accomplished by switches integrated into the chip.

Figure 9:
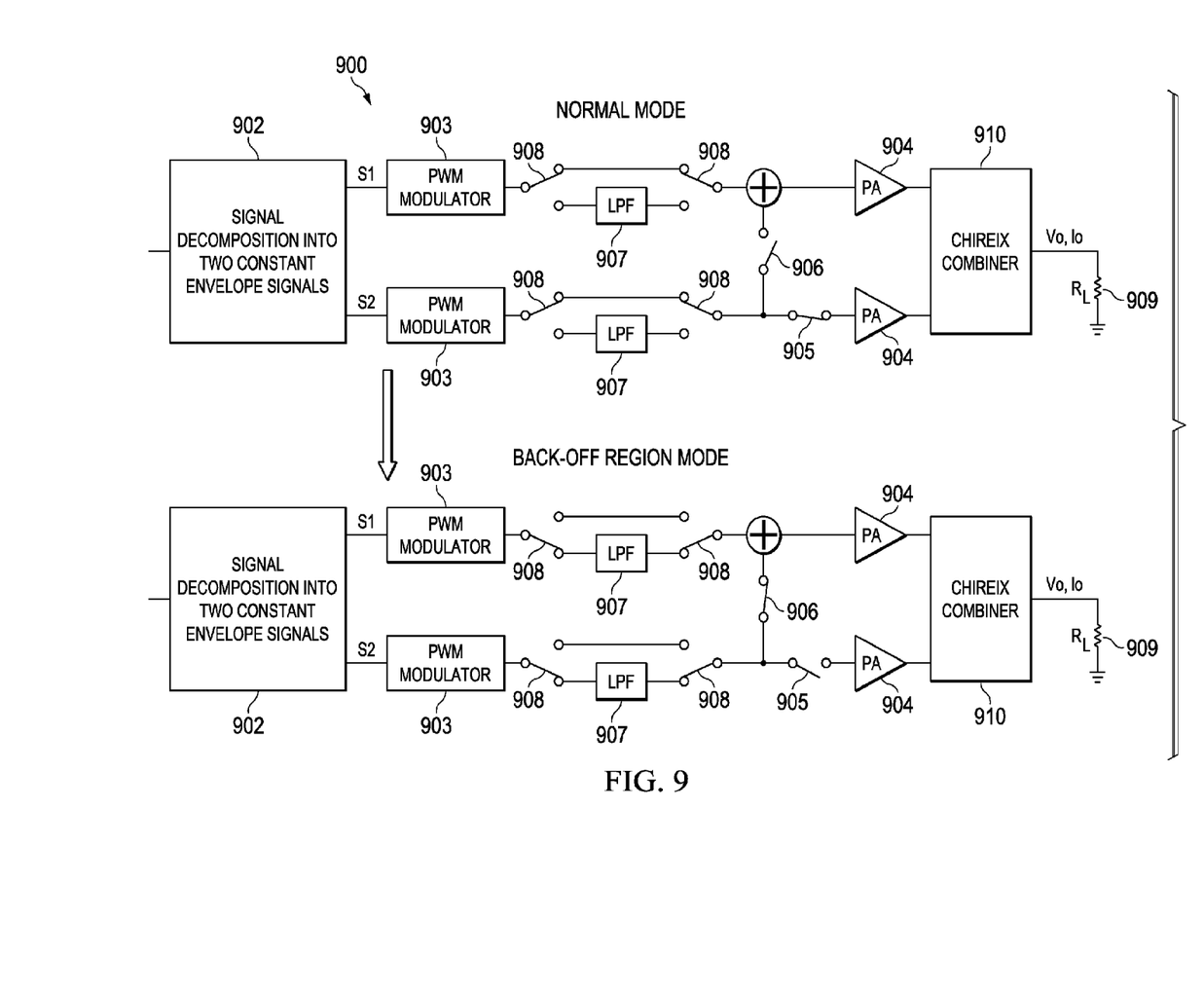
FIG. 9 shows another embodiment of the present invention.

FIG. 9 shows another embodiment of a PA circuit of present invention 900 that overcomes the limited dynamic range issue for PWM output. The PA circuit 900 comprises a signal decomposition block 902, two PWM modulators 903, a first switch 905, a second switch 906, two PAs 904, a Chireix combiner 910, and a load 909. Additionally, the partial outphasing circuit 900 comprises two low pass filters (LPFs) 907, each on a path between a corresponding PWM modulator 903 and a PA 904. The LPFs 907 can be connected to the two corresponding paths using two (or more) respective LPF switches 908. The switches of the PA circuit 900 can include mechanical switches, electrical switches, or combination of both. The components of the PA circuit 900 are arranged as shown in FIG. 9 or any other suitable arrangement. In another embodiment, any other type of suitable non-isolating combiner circuit can be coupled to the two PAs 904 (instead of the Chireix combiner 910) to combine the two amplified component signals (S1 and S2).

In a normal operation mode (outside the back-off region), the components of the PA circuit 900 operate similar to their corresponding components of the outphasing amplifier circuit 100. The first switch 905 is closed to send S2 to the corresponding PA 904 (e.g., on the inductive branch). The second switch 906 is opened to separate the signals between the two PAs 904 and respective branches. The LPF switches 908 on both branches are set to bypass the LPFs 907 between the corresponding PWM modulators 903 and PAs 904. In the back-off region, only one of the PAs 904 is used to amplify the incoming signal, while the other PA 904 is switched off by opening the first switch 905. Both decomposed signals S1 and S2 from the signal decomposition block 902 are modulated by their respective PWM modulators 903 and then combined at the operating PA 904 (e.g., on the capacitive branch) to provide the original input signal or a combined signal that has larger dynamic range than the decomposed signals S1 and S2 individually. Additionally, both signals are passed through the respective LPFs 907 by switching the LPF switches 908 as shown in FIG. 9. The LPFs 907 are used to eliminate higher harmonics in the signals to drive the operating PA 904 with a linear modulated signal (e.g., with sinusoidal pulses) instead of a PWM signal with narrow pulses (e.g., with square pulses). As such, the first signal S1 is forwarded from the corresponding PWM modulator 903 through the LPF 907 to the operating PA 904. The second signal S2 is redirected from its corresponding PWM modulator 903 through the corresponding LPF 907 to the same operating PA 904 by closing the second switch 906 (as shown in FIG. 9). The PA 904 then amplifies the combined signal with the increased dynamic range and smoother wider pulses.

Figure 10:
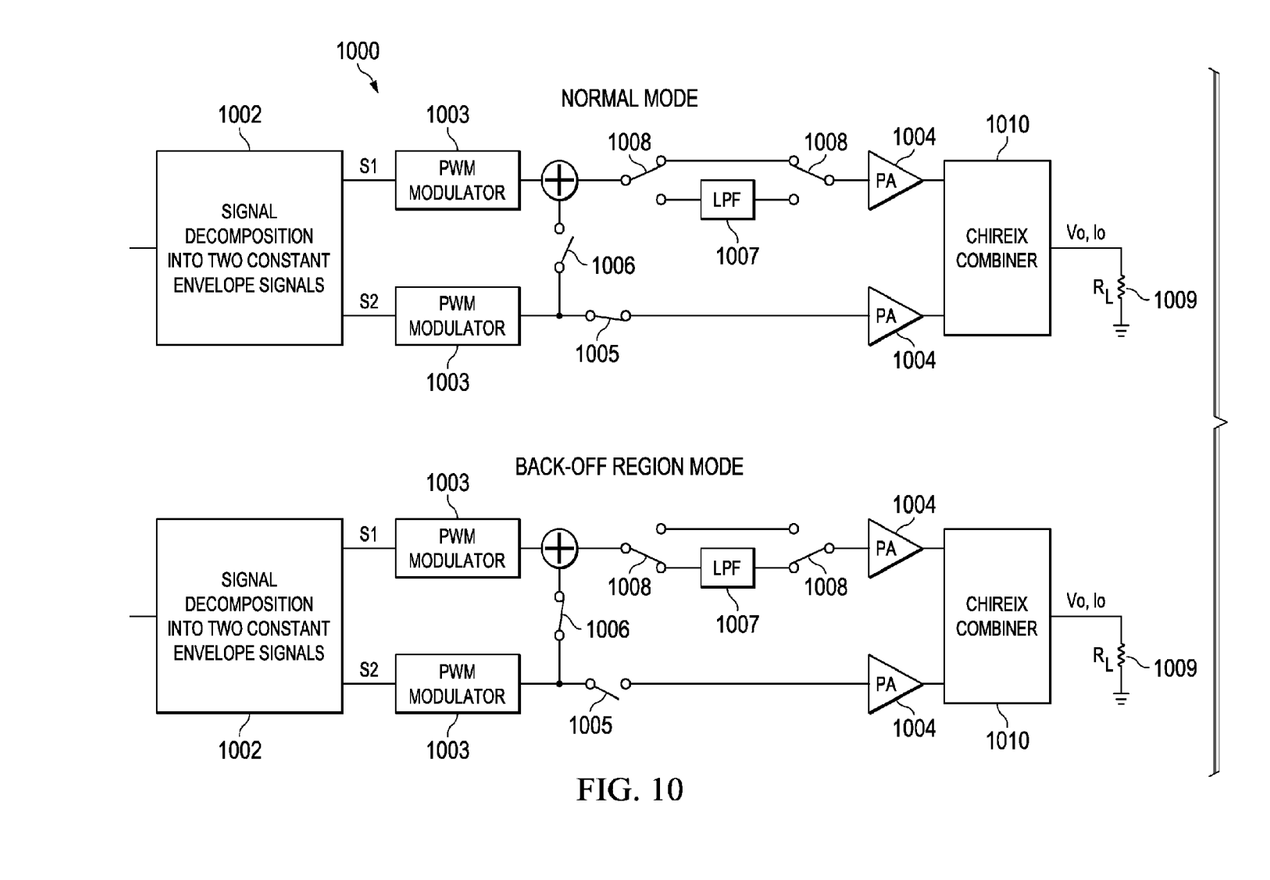
FIG. 10 shows another embodiment of the present invention.

FIG. 10 shows another embodiment of a PA circuit of the present invention 1000 that also uses a LPF for PWM output. The PA circuit 1000 comprises a signal decomposition block 1002, two PWM modulators 1003, a first switch 1005, a second switch 1006, two PAs 1004, a Chireix combiner 1010, and a load 1009. Additionally, the PA circuit 1000 comprises a LPF 1007 on a path between one PWM modulator 1003 and a corresponding PA 1004 (e.g., associated with the capacitive branch of the Chireix combiner 1010). The LPF 1007 can be connected to the corresponding path using two (or more) respective LPF switches 1008. The switches of the PA circuit 1000 can include mechanical switches, electrical switches, or combination of both. The components of the PA circuit 1000 are arranged as shown in FIG. 10 or any other suitable arrangement. In another embodiment, any other type of suitable non-isolating combiner circuit can be coupled to the two PAs 1004 (instead of the Chireix combiner 1010) to combine the two amplified component signals (S1 and S2).

In a normal operation mode (outside the back-off region), the components of the PA circuit 1000 operate similar to their corresponding components of the outphasing amplifier circuit 100. The first switch 1005 is closed to send S2 to the corresponding PA 1004 (e.g., on the inductive branch). The second switch 906 is opened to separate the signals between the two PAs 1004 and respective branches. The LPF switches 1008 are set to bypass the LPF 1007 between the PWM modulator 1003 and the PAs 1004 on the same branch. In the back-off region, only one of the PAs 1004 is used to amplify the incoming signal, while the other PA 1004 is switched off by opening the first switch 1005. Both decomposed signals S1 and S2 from the signal decomposition block 1002 are modulated by their respective PWM modulators 1003 and then combined before or at the LPF 1007, where the output is then forwarded to the operating PA 1004 (e.g., on the capacitive branch) to provide an original input signal or a combined signal that has larger dynamic range than the decomposed signals S1 and S2 individually. The combined signal is passed through the LPF 1007 by switching the LPF switches 1008 as shown in FIG. 10. The second signal S2 is redirected from its corresponding PWM modulator 1003 to be combined with the first signal S1 before or at the LPF 1007 on the other branch by closing the second switch 1006 (as shown in FIG. 10).

The embodiments described in FIG. 9 and FIG. 10 can also be modified to use band-pass filters (BPFs) instead of LPFs or combinations of LPFs and BPFs.

Figure 11:
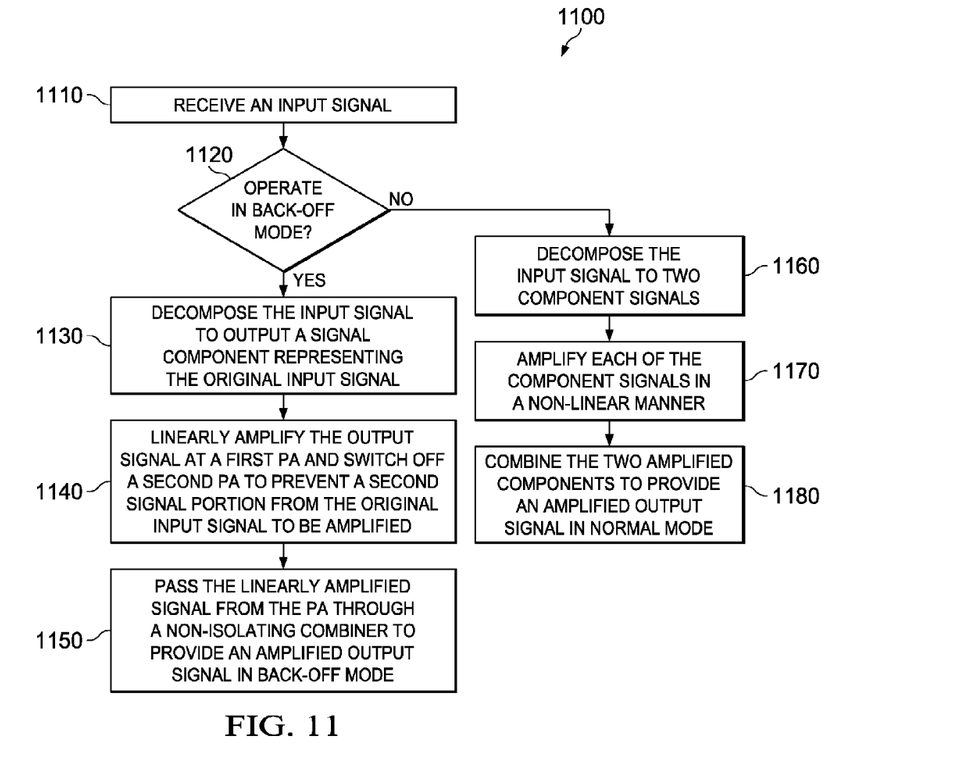
FIG. 11 shows an embodiment of an operation method of the present invention.

FIG. 11 shows an embodiment operation method of a PA circuit of present invention, e.g., the PA circuit 300. At step 1110, an input signal is received, e.g., at the signal decomposition block 302. At step 1120, the method 1100 determines (e.g., at the signal decomposition block 302) whether to operate in back-off mode (for lower power signals) according to the input signal's power. If the back-off mode operation is chosen, for example when a relatively low input signal below a threshold is detected, then the method 1100 proceeds to step 1130. Otherwise, the normal operation mode is chosen and the method 1100 proceeds to step 1160.

At step 1130, the input signal is decomposed (e.g., at the signal decomposition block 302) to output a component signal (e.g., S1) representing the original input signal to the signal decomposer. At step 1140, the output signal is linearly amplified at a first PA (e.g., at a PAs 304 associated with a capacitive branch of the Chireix combiner 310) and a second PA (e.g., the PAs 304 associated with the inductive branch of the Chireix combiner 310) is switched off to prevent a second signal portion from the original input signal to be amplified. At step 1150, the linearly amplified signal from the PA is passed through a non-isolating combiner (e.g., the Chireix combiner 310) to provide an amplified output signal in back-off mode.

Alternatively, at step 1160, the input signal is decomposed (e.g., at the signal decomposition block 302) to two component signals (e.g., S1 and S2). At step 1170, each of the component signals is amplified in a non-linear manner, e.g., at two corresponding PAs 304 associated respectively with the capacitive and inductive branches of the Chireix combiner 310. At step 1180, the two amplified components are combined, e.g., at the Chireix combiner 310, to provide an amplified output signal in normal mode.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A power amplifier comprising:
  a signal decomposer configured to receive an input signal;
  a non-isolating combiner coupled to the signal decomposer and configured to provide an amplified output signal corresponding to the input signal;
  a first power amplifier (PA) on a first branch between the signal decomposer and the non-isolating combiner;
  a capacitor of the non-isolating combiner coupled to the first branch;
  a second PA on a second branch between the signal decomposer and the non-isolating combiner,
  an inductor of the non-isolating combiner coupled to the second branch; and
  a switch on the second branch between the signal decomposer and the second PA, wherein the switch is configured to disconnect the second PA from the signal decomposer upon determining that the input signal is in a first condition, and further configured to connect the second PA to the signal decomposer upon determining that the input signal is in a second condition different from the first condition.

2. The power amplifier of claim 1, wherein determining that the input signal is in the first condition comprises determining that the input signal is in a back-off power region with relatively low signal power, and wherein determining that the input signal is in the second condition comprises determining that the input signal is not in the back-off power region.

3. The power amplifier of claim 1, wherein the non-isolating combiner is a Chireix combiner that comprises:
a first impedance and phase delay component coupled to the first PA on the first branch;
the capacitor coupled to the first branch between the first PA and the first impedance and phase delay component;
a second impedance and phase delay component coupled to the second PA on the second branch; and
the inductor coupled to the second branch between the second PA and the second impedance and phase delay component.

4. The power amplifier of claim 3 further comprising a load coupled to both the first impedance and phase delay component and the second impedance and phase delay component.

5. The power amplifier of claim 1 further comprising:
a first pulse width modulation (PWM) modulator on the first branch between the signal decomposer and the first PA;
a second PWM modulator at the second branch between the signal decomposer and the switch; and
a second switch on a path that links the first branch between the first PWM modulator and the first PA to the second branch between the second PWM modulator and the switch, wherein the second switch is configured to disconnect the first branch and the second branch upon determining that the input signal is the second condition and further configured to connect the first branch and the second branch upon determining that the input signal is in the first condition.

6. The power amplifier of claim 5 further comprising:
a first filter at the first branch between the first PWM modulator and the path that links the first branch to the second branch;
two first filter switches at the first branch configured to disconnect the first filter from the first branch upon determining that the input signal is in the second condition and further configured to connect the first filter to the first branch upon determining that the input signal is in the first condition;
a second filter at the second branch between the second PWM modulator and the path that links the first branch to the second branch; and
two second filter switches at the second branch configured to disconnect the second filter from the second branch upon determining that the input signal is in the second condition and further configured to connect the second filter to the second branch upon determining that the input signal is in the first condition.

7. The power amplifier of claim 6, wherein the first filter and the second filter include a low pass filter (LPF), a band pass filter (BPF), or a combination of LPF and BPF.

8. The power amplifier of claim 5 further comprising:
a filter at the first branch between the first PA and the path that links the first branch to the second branch; and
two first filter switches at the first branch configured to disconnect the filter from the first branch upon determining that the input signal is in the second condition and further configured to connect the filter to the first branch upon determining that the input signal is in the first condition.

9. The power amplifier of claim 1, wherein the input signal is in the first condition when a detected power of the input signal is below a determined power threshold.

10. The power amplifier of claim 1, wherein the switch is a mechanical switch or an electrical switch.

11. A power amplifier circuit comprising:
a signal decomposer configured to decompose an input signal into a first component signal and a second component signal;
a first power amplifier (PA) coupled to the signal decomposer and configured to amplify the first component signal;
a second PA coupled to the signal decomposer and configured to amplify the second component signal upon receiving the second component signal from the signal decomposer;
a non-isolating combiner having a capacitive branch coupled to the first PA, and having an inductive branch coupled to the second PA; and
a switch between the signal decomposer and the second PA configured to disconnect the second PA from the signal decomposer upon determining that the input signal is in a first condition and further configured to connect the second PA to the signal decomposer upon determining that the input signal is in a second condition different from the first condition.

12. The power amplifier circuit of claim 11, wherein determining that the input signal is in the first condition comprises determining that the input signal is in a back-off power region with relatively low signal power, and wherein determining that the input signal is in the second condition comprises determining that the input signal is not in the back-off power region.

13. The power amplifier circuit of claim 11, wherein upon determining that the input signal is in the first condition, the signal decomposer is further configured to modify the first component signal to provide an output representing the input signal.

14. The power amplifier circuit of claim 11, wherein the non-isolating combiner is configured to output a signal corresponding to the first component signal upon receiving the first component signal from the first PA without the second component signal from the second PA, and further configured to combine the first component signal and the second component signal upon receiving the first component signal from the first PA and the second component signal from the second PA.

15. The power amplifier circuit of claim 14, wherein the capacitive branch is configured to pass through the first component signal from the first PA.

16. The power amplifier circuit of claim 15, wherein the inductive branch is configured to pass through the second component signal upon receiving the second component signal from the second PA.

17. The power amplifier circuit of claim 11 further comprising:
a first pulse width modulation (PWM) modulator between the signal decomposer and the first PA configured to modulate the first component signal from the signal decomposer;
a second PWM modulator between the signal decomposer and the switch configured to modulate the second component signal from the signal decomposer; and a second switch on a path that links the second PWM modulator to the first PA and configured to redirect the second component signal from the second PWM modulator to the first PA upon determining that the input signal is in the first condition.

18. The power amplifier circuit of claim 17, wherein upon receiving the second component signal from the second PWM modulator, the first PA is further configured to combine the first component signal from the first PWM modulator and the second component signal from the second PWM modulator and amplify the combined first component signal and second component signal.

19. A method for outphased power amplification, the method comprising:
receiving, at a signal decomposer, an input signal;
determining whether the input signal is in a first power region or a second power region;
upon determining that the signal is in the second power region, linearly amplifying a portion of the input signal at a first power amplifier (PA) coupled to the signal decomposer;
passing the linearly amplified signal from the first PA through one of a capacitive branch or an inductive branch of a non-isolating combiner to provide an outphased amplified signal; and
inhibiting any remaining portion of the signal from passing to a second PA coupled to the signal decomposer.

20. The method of claim 19, wherein the second power region is a back-off power region with lower signal power relative to the first power region.

21. The method of claim 19 further comprising:
decomposing the input signal at the signal decomposer into a first component signal and a second component signal;
modulating the first component signal at a first pulse width modulation (PWM) modulator coupled to the signal decomposer;
modulating the second component signal at a second PWM modulator coupled to the signal decomposer;
sending the modulated first component signal from the first PWM modulator to the first PA;
redirecting via a switch the modulated second component signal from a first branch between the second PWM modulator and the second PA to a second branch between the first PWM modulator and the first PA; and
combining and amplifying the modulated first component signal and second component signal at the first PA to provide the linearly amplified signal to the non-isolating combiner.

22. The method of claim 21 further comprising:
filtering the modulated first component signal using a first low pass filter (LPF) before sending the modulated first component signal to the first PA; and
filtering the modulated second component signal using a second LPF before redirecting the modulated second component signal to the first PA.

23. The method of claim 21 further comprising:
filtering the modulated first component signal using a low pass filter (LPF) before sending the modulated first component signal to the first PA; and
filtering the modulated and then redirected second component signal using the same LPF.

24. The method of claim 19 further comprising:
upon determining that the signal is in the first power region, decomposing the input signal at the signal decomposer into a first component signal and a second component signal;
amplifying the first component signal at the first PA in a non-linear manner;
amplifying the second component signal at the second PA in a non-linear manner;
passing the amplified first component signal from the first PA through one of the capacitive branch or the inductive branch of the non-isolating combiner;
passing the amplified second component signal from the second PA through the other one of the capacitive branch or the inductive branch of the non-isolating combiner; and
combining the amplified first component signal and second component signal into an outphased amplified signal at a load coupled to the non-isolating combiner.

25. The method of claim 24 further comprising:
before amplifying the first component signal at the first PA, modulating the first component signal at a first pulse width modulation (PWM) modulator coupled to the signal decomposer; and
before amplifying the second component signal at the second PA, modulating the second component signal at a second PWM modulator coupled to the signal decomposer.

26. The method of claim 19, wherein inhibiting any remaining portion of the signal from passing to the second PA comprises turning off a second portion of the input signal that corresponds to a path from the non-isolating combiner to the second PA.

* * * * *